US012660702B2

(12) United States Patent     (10) Patent No.:   US 12,660,702 B2
Kim et al.              (45) Date of Patent:     Jun. 16, 2026

(54) SEMICONDUCTOR PACKAGE AND METHOD OF FABRICATING THE SAME

(71) Applicant: Samsung Electronics Co., Ltd., Suwon-si (KR)

(72) Inventors: Seongyo Kim, Suwon-si (KR); Un-Byoung Kang, Suwon-si (KR); Sang-Sick Park, Suwon-si (KR); Hanmin Lee, Suwon-si (KR); Seungyoon Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 382 days.

(21) Appl. No.: 18/213,852

(22) Filed: Jun. 25, 2023

(65) Prior Publication Data

US 2024/0162193 A1     May 16, 2024

(30) Foreign Application Priority Data

Nov. 10, 2022    (KR) ........................ 10-2022-0149900
Jan. 2, 2023     (KR) ........................ 10-2023-0000383

(51) Int. Cl.
| | |
|---|---|
| *H10W 90/00* | (2026.01) |
| *B23K 26/38* | (2014.01) |
| *B23K 26/40* | (2014.01) |
| *H10W 20/20* | (2026.01) |
| *H10W 74/01* | (2026.01) |
| *H10W 74/10* | (2026.01) |
| *B23K 101/40* | (2006.01) |

(Continued)

(52) U.S. Cl.
CPC ............. *H10W 90/00* (2026.01); *B23K 26/38* (2013.01); *B23K 26/40* (2013.01); *H10W 20/20* (2026.01); *H10W 74/016* (2026.01); *H10W 74/117* (2026.01); *B23K 2101/40* (2018.08); *H10W 74/15* (2026.01); *H10W 90/297* (2026.01); *H10W 90/724* (2026.01); *H10W 90/734* (2026.01)

(58) Field of Classification Search
CPC ............... H01L 25/0657; H01L 21/565; H01L 23/3128; H01L 23/481; H01L 24/16; H01L 24/32; H01L 24/73; H01L 2224/16227; H01L 2224/32225; H01L 2224/73204; H01L 2225/06517; H01L 2225/06541; B23K 26/38; B23K 26/40; B23K 2101/40
See application file for complete search history.

(56) References Cited

U.S. PATENT DOCUMENTS

| | | |
|---|---|---|
| 10,153,255 B2 | 12/2018 | Hwang et al. |
| 10,403,603 B2 | 9/2019 | Park et al. |
| 10,515,932 B2 | 12/2019 | Tsuji |

(Continued)

*Primary Examiner* — Jacob Y Choi
*Assistant Examiner* — Neil R Prasad
(74) *Attorney, Agent, or Firm* — Muir Patent Law, PLLC

(57) ABSTRACT

Disclosed are semiconductor packages and their fabrication methods. The semiconductor package comprises a first semiconductor chip, a lower adhesion layer on the first semiconductor chip, a second semiconductor chip on the lower adhesion layer, an upper adhesion layer on the second semiconductor chip, and a third semiconductor chip on the upper adhesion layer. The lower adhesion layer includes a first cutting surface connected to a top surface of the lower adhesion layer. The upper adhesion layer is in contact with the first cutting surface of the lower adhesion layer.

20 Claims, 16 Drawing Sheets

(51) Int. Cl.
    *H10W 74/15*          (2026.01)
    *H10W 90/20*          (2026.01)

(56)                References Cited

U.S. PATENT DOCUMENTS

| | | | | |
|---|---|---|---|---|
| 10,804,212 | B2 | 10/2020 | Ko et al. | |
| 11,024,595 | B2 | 6/2021 | McClain et al. | |
| 2011/0057327 | A1* | 3/2011 | Yoshida ................ | H01L 23/544 |
| | | | | 257/777 |
| 2012/0025218 | A1* | 2/2012 | Ito ...................... | H10H 20/8514 |
| | | | | 257/E33.061 |
| 2017/0154880 | A1* | 6/2017 | Ozeki ..................... | H01L 24/96 |
| 2017/0365582 | A1* | 12/2017 | Seo ......................... | H01L 24/33 |
| 2018/0145060 | A1* | 5/2018 | Appelt ................ | H01L 25/0652 |
| 2021/0143008 | A1 | 5/2021 | Ko et al. | |
| 2022/0020656 | A1 | 1/2022 | Jung et al. | |

* cited by examiner

SEMICONDUCTOR PACKAGE AND METHOD OF FABRICATING THE SAME

CROSS-REFERENCE TO RELATED APPLICATIONS

This U.S. nonprovisional application claims priority under 35 U.S.C. § 119 to Korean Patent Applications No. 10-2022-0149900, filed on Nov. 10, 2022, and No. 10-2023-0000383, filed on Jan. 2, 2023, in the Korean Intellectual Property Office, the disclosures of both of which are hereby incorporated by reference in their entirety.

BACKGROUND

The present inventive concepts relate to a semiconductor package and a method of fabricating the same, and more particularly, to a semiconductor package including an upper adhesion layer and a lower adhesion layer and a method of fabricating the same.

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the printed circuit board. With the development of electronic industry, various studies have been conducted to improve reliability and durability of semiconductor packages.

SUMMARY

Some embodiments of the present inventive concepts provide a semiconductor package improved electrical properties and increased reliability and a method of fabricating the same.

According to some embodiments of the present inventive concepts, a semiconductor package may comprise: a first semiconductor chip; a lower adhesion layer on the first semiconductor chip; a second semiconductor chip on the lower adhesion layer; an upper adhesion layer on the second semiconductor chip; and a third semiconductor chip on the upper adhesion layer. The lower adhesion layer may include a first cutting surface connected to a top surface of the lower adhesion layer. The upper adhesion layer may be in contact with the first cutting surface of the lower adhesion layer.

According to some embodiments of the present inventive concepts, a semiconductor package may comprise: a first semiconductor chip; a lower adhesion layer on the first semiconductor chip; a second semiconductor chip on the lower adhesion layer; an upper adhesion layer on the second semiconductor chip; and a third semiconductor chip on the upper adhesion layer. The lower adhesion layer may include a first part and a second part on the first part of the lower adhesion layer. A width of the first part of the lower adhesion layer may be greater than a width of the second part of the lower adhesion layer. The second part of the lower adhesion layer may include a first cutting surface in contact with the upper adhesion layer.

According to some embodiments of the present inventive concepts, a semiconductor package may comprise: a base structure; a first connection adhesion layer on the base structure; a first semiconductor chip on the first connection adhesion layer; a second connection adhesion layer on the first semiconductor chip; a second semiconductor chip on the second connection adhesion layer; a lower adhesion layer on the second semiconductor chip; a third semiconductor chip on the lower adhesion layer; an upper adhesion layer on the third semiconductor chip; a fourth semiconductor chip on the upper adhesion layer; a plurality of bumps that connect the first to fourth semiconductor chips to each other: and a molding layer that surrounds the first to fourth semiconductor chips. Each of the first to third semiconductor chips may include: a lower dielectric layer; a substrate on the lower dielectric layer; an upper dielectric layer on the substrate; and a through via that penetrates the substrate. The lower adhesion layer may include: a first cutting surface connected to a top surface of the lower adhesion layer; and a second cutting surface connected to the first cutting surface. The first cutting surface and the second cutting surface may be flat. The upper adhesion layer may be in contact with the first cutting surface and the second cutting surface.

According to some embodiments of the present inventive concepts, a method of fabricating a semiconductor package may comprise: forming a first semiconductor chip; forming a lower adhesion layer and a second semiconductor chip on the first semiconductor chip; cutting the lower adhesion layer to form a first cutting surface of the lower adhesion layer; and forming an upper adhesion layer and a third semiconductor chip on the second semiconductor chip. The upper adhesion layer may be in contact with the first cutting surface of the lower adhesion layer.

DETAILED DESCRIPTION OF EMBODIMENTS

The following will describe in detail a semiconductor package and its fabrication method according to example embodiments of the present inventive concepts in conjunction with the accompanying drawings. Like numerals refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Although the figures described herein may be referred to using language such as "example embodiment," "one embodiment," or "certain embodiments," these figures and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

Figure 1A:
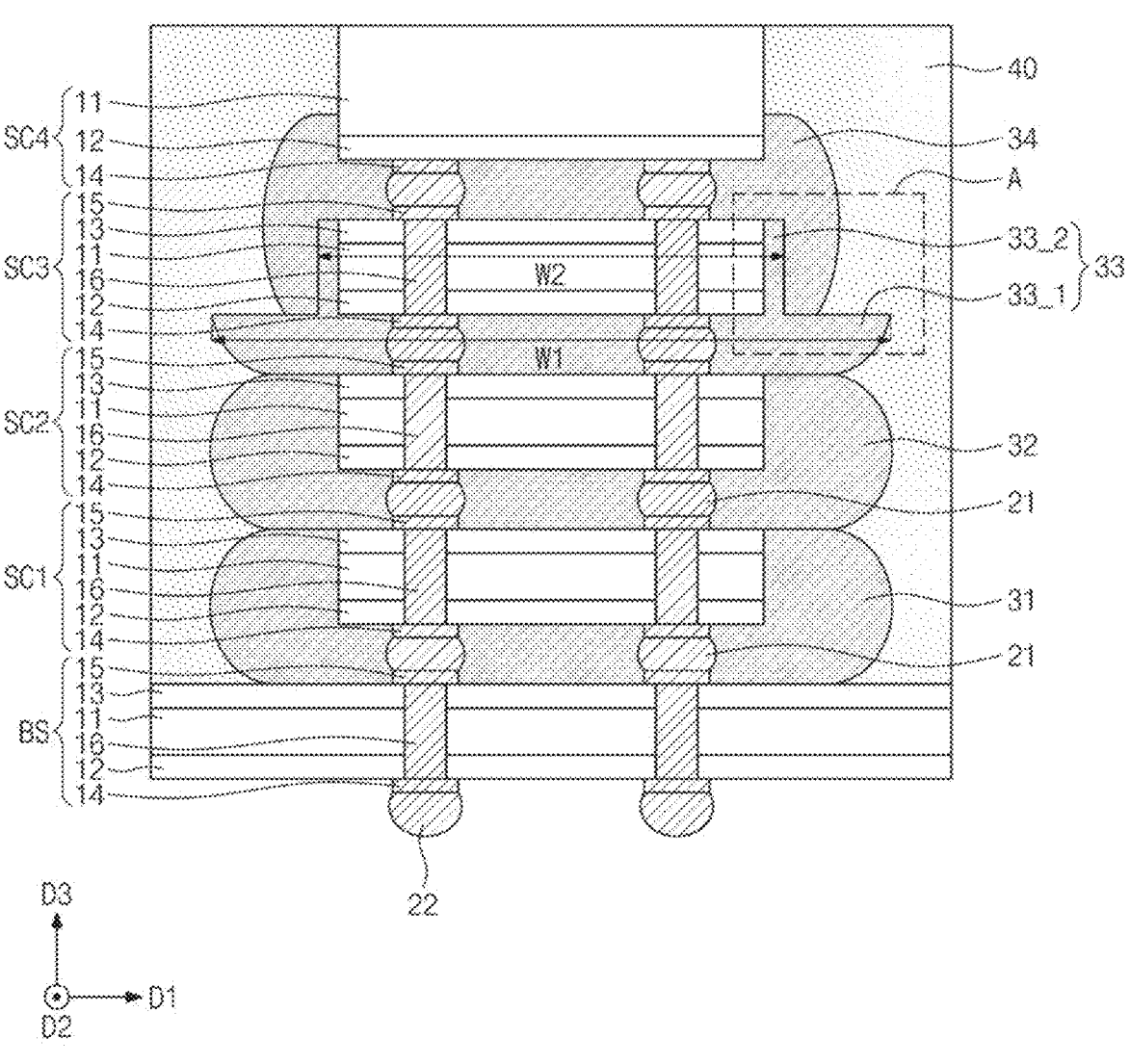
FIG. 1A illustrates a cross-sectional view showing a semiconductor package, according to example embodiments.
Figure 1B:
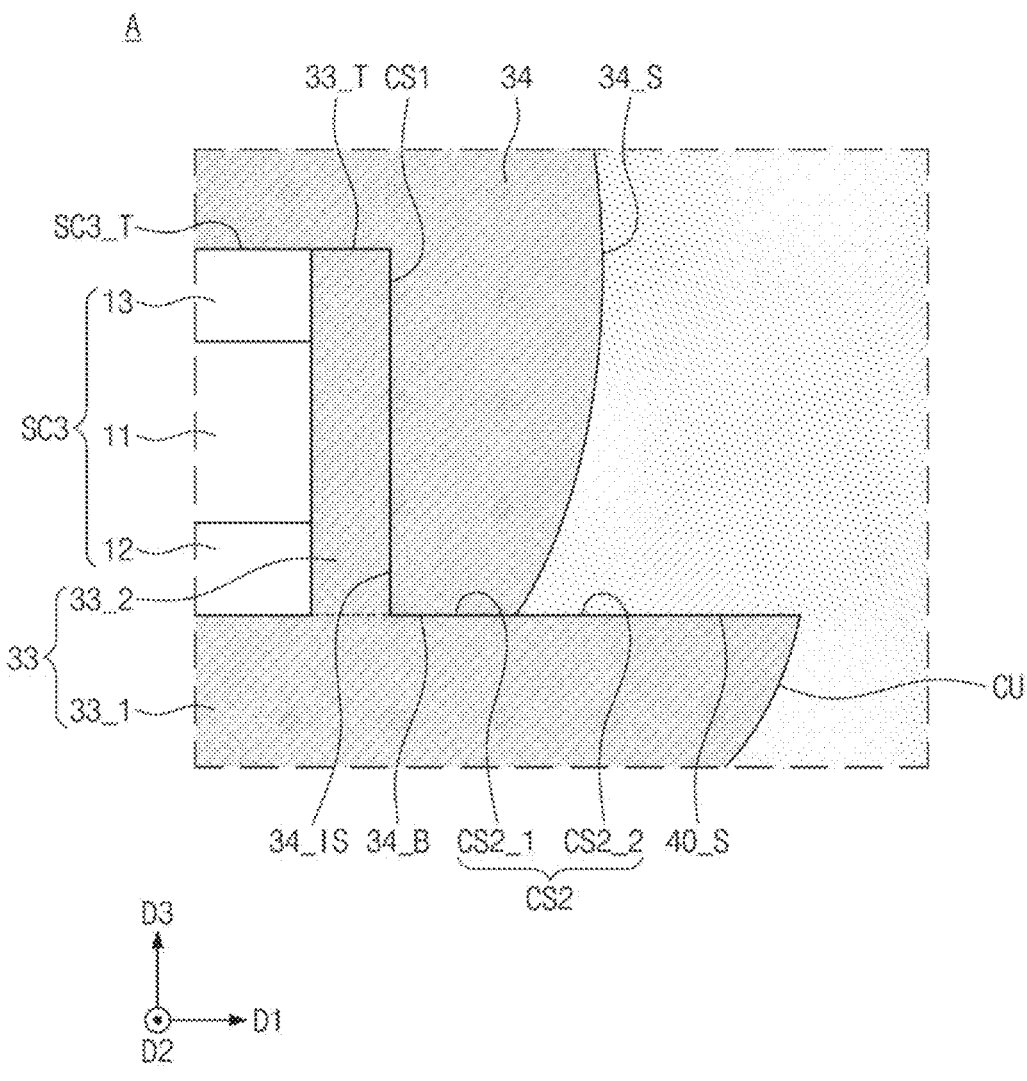
FIG. 1B illustrates an enlarged view showing section A of FIG. 1A.
Figure 1C:
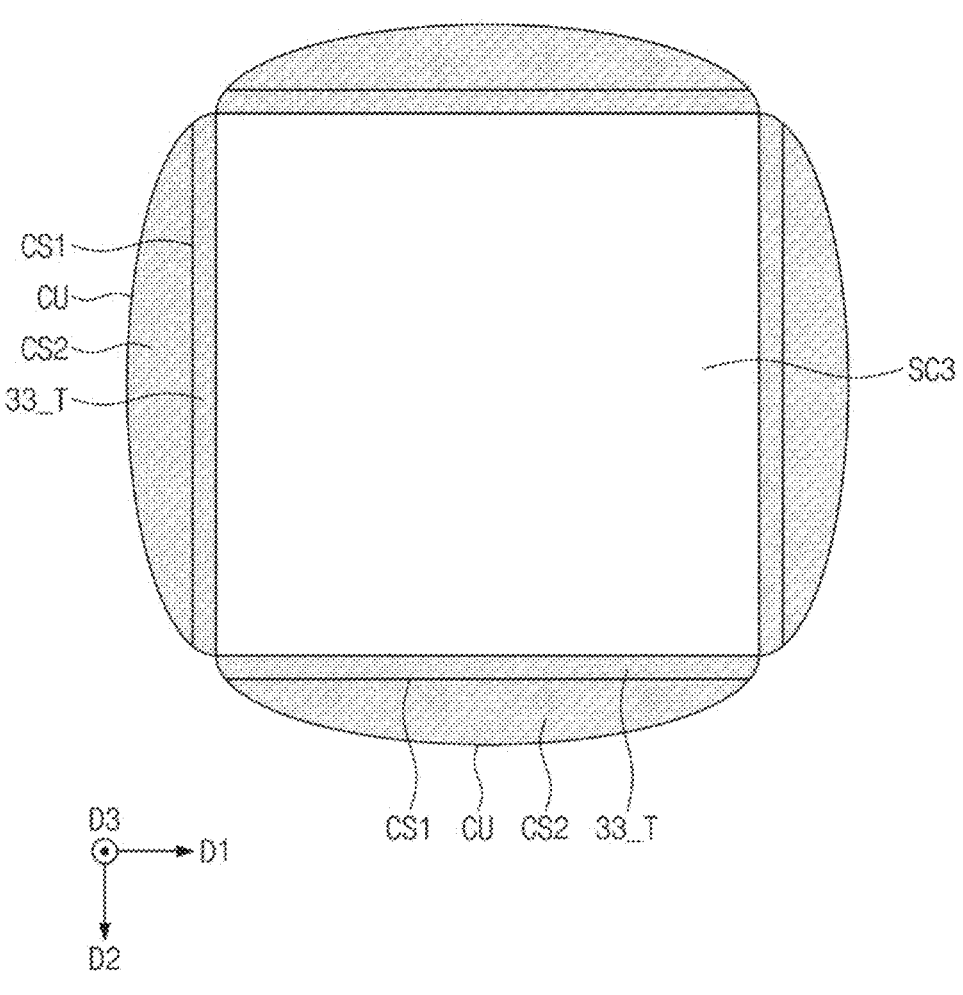
FIG. 1C illustrates a plan view showing a lower adhesion layer of FIG. 1A.

FIG. 1A illustrates a cross-sectional view showing a semiconductor package according to example embodiments. FIG. 1B illustrates an enlarged view showing section A of FIG. 1A. FIG. 1C illustrates a plan view showing a lower adhesion layer of FIG. 1A.

Referring to FIGS. 1A, 1B, and 1C, a semiconductor package may include a base structure BS, a first semiconductor chip SC1, a second semiconductor chip SC2, a third semiconductor chip SC3, and a fourth semiconductor chip SC4.

Each of the base structure BS, the first semiconductor chip SC1, the second semiconductor chip SC2, and the third semiconductor chip SC3 may include a substrate 11, a lower dielectric layer 12, an upper dielectric layer 13, lower pads 14, upper pads 15, and through vias 16. The fourth semiconductor chip SC4 may include a substrate 11, a lower dielectric layer 12, and lower pads 14.

The substrate 11 may have a plate shape that extends along a plane defined by a first direction D1 and a second direction D2. The first direction D1 and the second direction D2 may intersect each other. For example, the first direction D1 and the second direction D2 may be horizontal directions that are orthogonal to each other. The substrate 11 may be a semiconductor substrate. For example, the substrate 11 may include silicon, germanium, silicon-germanium, gallium-phosphorus, or gallium-arsenic. In some embodiments, the substrate 11 may be a silicon-on-insulator (SOI) substrate or a germanium-on-insulator (GOI) substrate.

The lower dielectric layer 12 may cover a bottom surface of the substrate 11. The lower dielectric layer 12 may be formed of a dielectric material. For example, the lower dielectric layer 12 may include oxide. The upper dielectric layer 13 may cover a top surface of the substrate 11. The upper dielectric layer 13 may be formed of a dielectric material. For example, the upper dielectric layer 13 may include oxide.

In some embodiments, each of the base structure BS, the first semiconductor chip SC1, the second semiconductor chip SC2, the third semiconductor chip SC3, and the fourth semiconductor chip SC4 may include a semiconductor device disposed between the substrate 11 and the lower dielectric layer 12. For example, each of the base structure BS, the first semiconductor chip SC1, the second semiconductor chip SC2, the third semiconductor chip SC3, and the fourth semiconductor chip SC4 may include a memory semiconductor device or a logic semiconductor device.

The lower pads 14 may be provided on a bottom surface of the lower dielectric layer 12. The upper pads 15 may be provided on a top surface of the upper dielectric layer 13. The lower pads 14 and the upper pads 15 may include a conductive material.

The through vias 16 may penetrate in the third direction D3 through the substrate 11 to electrically connect the lower pads 14 and the upper pads 15 to each other. The third direction D3 may intersect the first direction D1 and the second direction D2. For example, the third direction D3 may be a vertical direction perpendicular to the first direction D1 and the second direction D2. The through electrode 16 may include a conductive material.

In some embodiments, each of the base structure BS, the first semiconductor chip SC1, the second semiconductor chip SC2, and the third semiconductor chip SC3 may further include a conductive structure that electrically connects the through via 16 and the lower pad 14 to each other.

The base structure BS, the first semiconductor chip SC1, the second semiconductor chip SC2, the third semiconductor chip SC3, and the fourth semiconductor chip SC4 may be sequentially arranged along the third direction D3. For example, the base structure BS and the first, second, third, and fourth semiconductor chips SC1, SC2, SC3, and SC4 may be stacked in the third direction D3. The base structure BS may have a width greater than those of the first, second, third, and fourth semiconductor chips SC1, SC2, SC3, and SC4. For example, a width in the first direction D1 of the base structure BS may be greater than a width in the first direction D1 of each of the first, second, third, and fourth semiconductor chips SC1, SC2, SC3, and SC4. In some embodiments, the base structure BS may include a printed circuit board (PCB) or a redistribution substrate including redistribution patterns.

The semiconductor package may further include bumps 21. The bumps 21 may be provided between the base structure BS and the first semiconductor chip SC1, between the first semiconductor chip SC1 and the second semiconductor chip SC2, between the second semiconductor chip SC2 and the third semiconductor chip SC3, and/or between the third semiconductor chip SC3 and the fourth semiconductor chip SC4. The bumps 21 may connect to each other the base structure BS and the first, second, third, and fourth semiconductor chips SC1, SC2, SC3, and SC4. For example, each bump 21 may contact both a lower pad 14 and a corresponding upper pad 15. The bumps 21 may be formed of a conductive material. For example, the bumps 21 may include at least one selected from copper and nickel.

The semiconductor package may further include terminals 22. Each terminal 22 may be connected to the lower pad 14 of the base structure BS. The semiconductor package may be electrically connected through the terminal 22 to an external apparatus. The terminal 22 may include a conductive material.

The semiconductor package may further include adhesion layers 31, 32, 33, and 34. The adhesion layers 31, 32, 33, and 34 may include a first connection adhesion layer 31, a second connection adhesion layer 32, a lower adhesion layer 33, and an upper adhesion layer 34. The first connection adhesion layer 31 may be provided on the base structure BS. The second connection adhesion layer 32 may be provided on the first connection adhesion layer 31 and the first semiconductor chip SC1. The lower adhesion layer 33 may be provided on the second connection adhesion layer 32 and the second semiconductor chip SC2. The upper adhesion layer 34 may be provided on the lower adhesion layer 33 and the third semiconductor chip SC3.

The upper adhesion layer 34 may be defined to indicate an uppermost one of the adhesion layers 31, 32, 33, and 34, and the lower adhesion layer 33 may be defined to indicate an adhesion layer in contact with the upper adhesion layer 34. The first connection adhesion layer 31, the second connection adhesion layer 32, the lower adhesion layer 33, and the upper adhesion layer 34 may be arranged along the third direction D3.

The first connection adhesion layer 31 may be disposed between the base structure BS and the first semiconductor chip SC1. The first connection adhesion layer 31 may contact an upper surface of the base structure BS. The first connection adhesion layer 31 may surround the first semiconductor chip SC1. In example embodiments, the first connection adhesion layer 31 may contact a lower surface and side surfaces of the first semiconductor chip SC1. The first connection adhesion layer 31 may surround and contact the bumps 21, the lower pads 14, and the upper pads 15 provided between the base structure BS and the first semiconductor chip SC1. The second connection adhesion layer 32 may be disposed between the first semiconductor chip SC1 and the second semiconductor chip SC2. The second connection adhesion layer 32 may contact upper surfaces of the first semiconductor chip SC1 and the first connection adhesion layer 31. The second connection adhesion layer 32 may surround the second semiconductor chip SC2. In example embodiments, the second connection adhesion layer 32 may contact a lower surface and side surfaces of the second semiconductor chip SC2. The second connection adhesion layer 32 may surround and contact the bumps 21, the lower pads 14, and the upper pads 15 provided between the first semiconductor chip SC1 and the second semiconductor chip SC2. The lower adhesion layer 33 may be disposed between the second semiconductor chip SC2 and the third semiconductor chip SC3. The lower adhesion layer 33 may contact upper surfaces of the second semiconductor chip SC2 and the second connection adhesion layer 32. The lower adhesion layer 33 may surround the third semiconductor chip SC3. In example embodiments, the lower adhesion layer 33 may contact a lower surface and side surfaces of the third semiconductor chip SC3. The lower adhesion layer 33 may surround and contact the bumps 21, the lower pads 14, and the upper pads 15 provided between the second semiconductor chip SC2 and the third semiconductor chip SC3. The upper adhesion layer 34 may be disposed between the third semiconductor chip SC3 and the fourth semiconductor chip SC4. The upper adhesion layer 34 may contact an upper surface of the third semiconductor chip SC3 and upper and side surfaces of the lower adhesion layer 33. The upper adhesion layer 34 may surround the third semiconductor chip SC3 and the fourth semiconductor chip SC4. In example embodiments, the upper adhesion layer 34 may contact a portion of the side surfaces of the fourth semiconductor chip. The upper adhesion layer 34 may surround and contact the bumps 21, the lower pads 14, and the upper pads 15 provided between the third semiconductor chip SC3 and the fourth semiconductor chip SC4.

The first connection adhesion layer 31, the second connection adhesion layer 32, the lower adhesion layer 33, and the upper adhesion layer 34 may be formed of an adhesive polymer material. For example, the first connection adhesion layer 31, the second connection adhesion layer 32, the lower adhesion layer 33, and the upper adhesion layer 34 may include a non-conductive film (NCF).

The semiconductor package may further include a molding layer 40 on the base structure BS. The molding layer 40 may surround the first, second, third, and fourth semiconductor chips SC1, SC2, SC3, and SC4 and the bumps 21. In example embodiments, the molding layer may contact a top surface of the base structure BS, sidewalls of the fourth semiconductor chip SC4, and surfaces of the first connection adhesion layer 31, the second connection adhesion layer 32, the lower adhesion layer 33, and the upper adhesion layer 34. In some embodiments, a top surface of the molding layer 40 may be coplanar with a top surface of the fourth semiconductor chip SC4. The molding layer 40 may be formed of a polymer material. For example, the molding layer 40 may include an epoxy molding compound (EMC).

The lower adhesion layer 33 may include a first part 33_1 and a second part 33_2 on the first part 33_1. The first part 33_2 of the lower adhesion layer 33 may be located at a higher level than that of the first part 33_1 of the lower adhesion layer 33. The first part 33_1 of the lower adhesion layer 33 may be interposed between the second semiconductor chip SC2 and the third semiconductor chip SC3. The second part 33_2 of the lower adhesion layer 33 may surround the third semiconductor chip SC3. For example, the second part 33_2 of the lower adhesion layer 33 may contact the sidewalls of the third semiconductor chip SC3. The first part 33_1 of the lower adhesion layer 33 may have a width greater than that of the second part 33_2 of the lower adhesion layer 33. For example, a maximum width W1 in the first direction D1 of the first part 33_1 of the lower adhesion layer 33 may be greater than a maximum width W2 in the first direction D1 of the second part 33_2 of the lower adhesion layer 33. For example, a minimum width in the first direction D1 of the first part 33_1 of the lower adhesion layer 33 may be greater than the maximum width W2 in the first direction D1 of the second part 33_2 of the lower adhesion layer 33. The width of the first part 33_1 of the lower adhesion layer 33 may decrease in a downward direction. The second part 33_2 of the lower adhesion layer 33 may be spaced apart from the second semiconductor chip SC2. The lower adhesion layer 33 may include four second parts 33_2, and the four second parts 33_2 may surround the third semiconductor chip SC3. For example, each of the four second parts 33_2 may be provided on a corresponding sidewall of the third semiconductor chip SC3. In some embodiments, the lower adhesion layer 33 may include one second part 33_2, and the one second part 33_2 may surround the third semiconductor chip SC3.

The lower adhesion layer 33 may include first cutting surfaces CS1 and second cutting surfaces CS2. Four first cutting surfaces CS1 and four second cutting surfaces CS2 may be provided to correspond to four sidewalls of the third semiconductor chip SC3.

The first cutting surface CS1 may be a sidewall of the second part 33_2 of the lower adhesion layer 33. The second cutting surface CS2 may be a top surface of the first part 33_1 of the lower adhesion layer 33. The first cutting surface CS1 may be connected to a top surface 33_T of the lower adhesion layer 33. A width in the first direction D1 at the top surface 33_T of the lower adhesion layer 33 may range from about 5 μm to about 100 μm, and a width in the second direction D2 at the top surface 33_T of the lower adhesion layer 33 may range from about 5 μm to about 100 μm.

A corner may be provided to connect the first cutting surface CS1 to the top surface 33_T of the lower adhesion layer 33. The top surface 33_T of the lower adhesion layer 33 may be a top surface of the second part 33_2 of the lower adhesion layer 33. The first cutting surface CS1 and the second cutting surface CS2 may intersect each other. The first cutting surface CS1 may intersect the top surface 33_T of the lower adhesion layer 33.

The lower adhesion layer 33 may include a curved sidewall CU connected to the second cutting surface CS2. The curved sidewall CU may be curved in the horizontal direction and in the vertical direction. For example, the curved sidewall CU may appear curved when viewed in plan view and/or when viewed in cross-section. A corner may be provided to connect the second cutting surface CS2 and the curved sidewall CU to each other. The curved sidewall CU may be a sidewall of the first part 33_1 of the lower adhesion layer 33. The lower adhesion layer 33 may be flat on the top surface 33_T, the first cutting surface CS1, and the second cutting surface CS2 thereof. The curved sidewall CU may be curved. In some embodiments, the lower adhesion layer 33 may be curved on the top surface 33_T thereof.

The first cutting surface CS1 and the second cutting surface CS2 may be connected to each other. A corner may be provided to connect the first cutting surface CS1 and the second cutting surface CS2 to each other. The first cutting surface CS1 and the second cutting surface CS2 may connect to each other the top surface 33_T and the curved sidewall CU of the lower adhesion layer 33. The first cutting surface CS1 and the second cutting surface CS2 may be disposed between the top surface 33_T and the curved sidewall CU of the lower adhesion layer 33.

The top surface 33_T and the second cutting surface CS2 of the lower adhesion layer 33 may be parallel to the first direction D1. The first cutting surface CS1 may be parallel to the third direction D3. The top surface 33_T of the lower adhesion layer 33 may be coplanar with a top surface SC3_T of the third semiconductor chip SC3. The top surface 33_T of the lower adhesion layer 33 may be located at the same level as that of the top surface SC3_T of the third semiconductor chip SC3.

A distance between the first cutting surface CS1 and the third semiconductor chip SC3 may be less than a distance between the curved sidewall CU and the third semiconductor chip SC3. A distance between the second cutting surface CS2 and the third semiconductor chip SC3 may be less than the distance between the curved sidewall CU and the third semiconductor chip SC3.

The second cutting surface CS2 of the lower adhesion layer 33 may include a first part CS2_1 and a second part CS2_2. The first part CS2_1 of the second cutting surface CS2 may be in contact with the upper adhesion layer 34. The second part CS2_2 of the second cutting surface CS2 may be in contact with the molding layer 40. The first part CS2_1 of the second cutting surface CS2 may be connected to the first cutting surface CS1. The second part CS2_2 of the second cutting surface CS2 may be connected to the curved sidewall CU.

The upper adhesion layer 34 may have a bottom surface 34_B in contact with the first part CS2_1 of the second cutting surface CS2 of the lower adhesion layer 33. The upper adhesion layer 34 may have an inner sidewall 34_IS in contact with the first cutting surface CS1 of the lower adhesion layer 33. The upper adhesion layer 34 may be flat on the bottom surface 34_B thereof. The bottom surface 34_B of the upper adhesion layer 34 may be parallel to the first direction D1. The upper adhesion layer 34 may be flat on the inner sidewall 34_IS thereof. The inner sidewall 34_IS of the upper adhesion layer 34 may be parallel to the third direction D3.

The molding layer 40 may have a contact surface 40_S in contact with the second part CS2_2 of the second cutting surface CS2 of the lower adhesion layer 33. The molding layer 40 may be flat on the contact surface 40_S thereof. The contact surface 40_S of the molding layer 40 may be parallel to the first direction D1. The contact surface 40_S of the molding layer 40 may be coplanar with the bottom surface 34_B of the upper adhesion layer 34.

The upper adhesion layer 34 may have a curved sidewall 34_S. The sidewall 34_S of the upper adhesion layer 34 may be in contact with the molding layer 40. A corner may be provided to connect to each of the sidewall 34_S and the bottom surface 34_B of the upper adhesion layer 34.

In the semiconductor package according to some embodiments, the lower adhesion layer 33 may include the first cutting surface CS1 and the second cutting surface CS2, and thus the upper adhesion layer 34 may be located at a relatively low level and may not be exposed to outside the molding layer 40. It may thus be possible to prevent or avoid cracks from being produced by the upper adhesion layer 34 that is exposed to outside the molding layer 40.

Figure 2A:
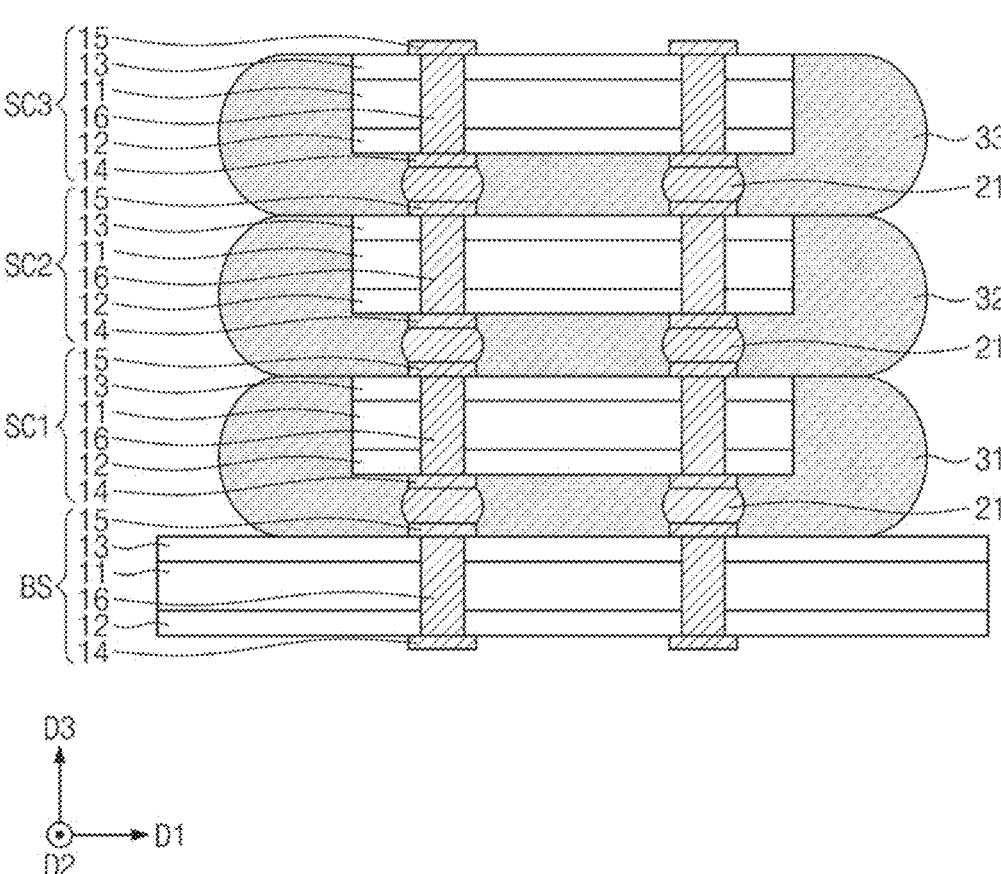
FIGS. 2A, 2B, and 2C illustrate cross-sectional views showing a method of fabricating a semiconductor package, according to example embodiments.
Figure 2B:
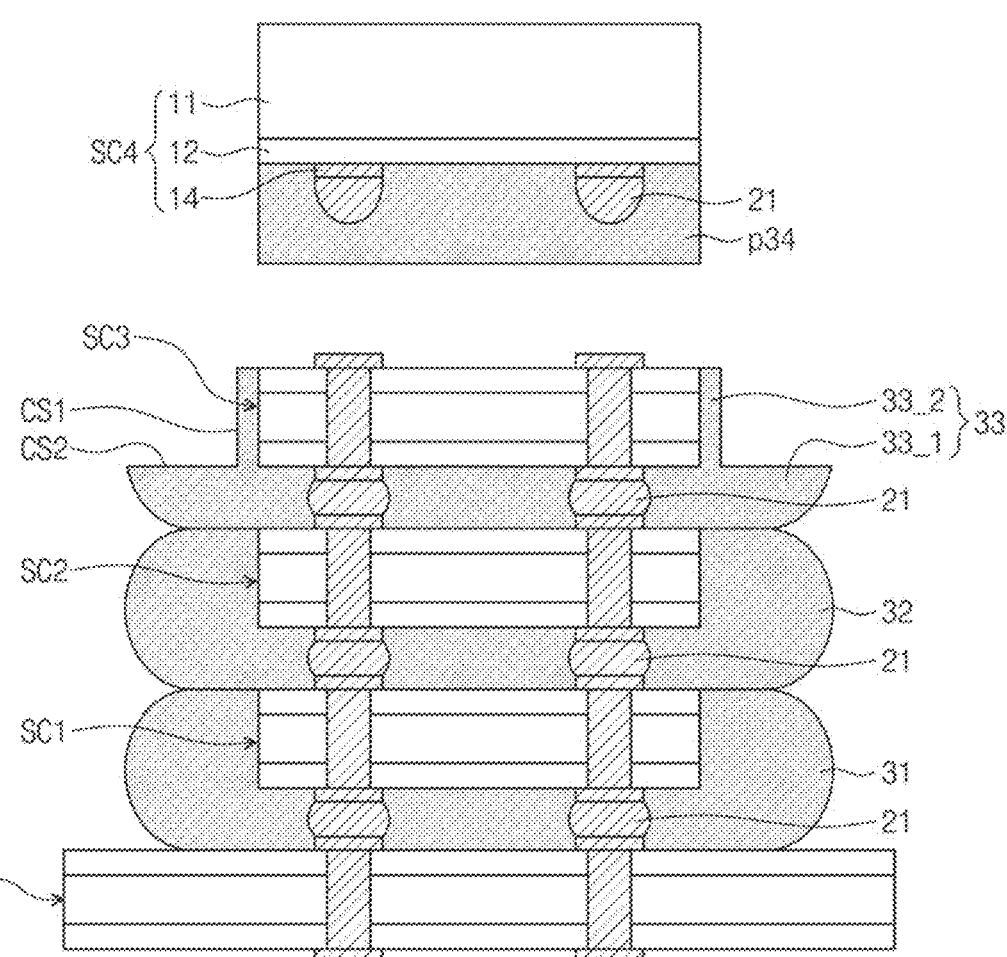
Figure 2B:
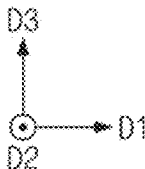
Figure 2C:
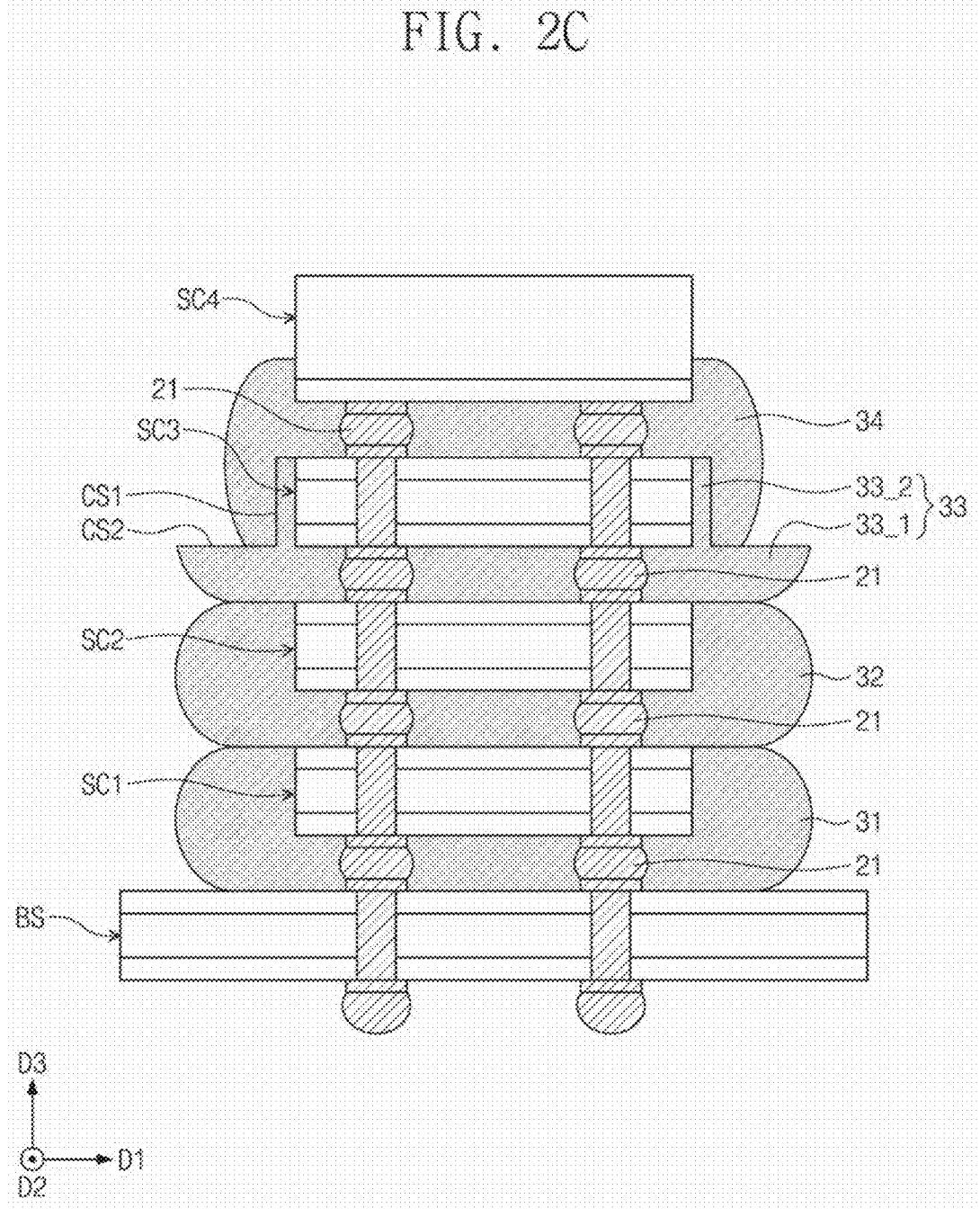

FIGS. 2A, 2B, and 2C illustrate cross-sectional views showing a method of fabricating a semiconductor package according to example embodiments.

Referring to FIG. 2A, a base structure BS may be formed. The base structure BS may include a substrate 11, a lower dielectric layer 12, an upper dielectric layer 13, lower pads 14, upper pads 15, and through vias 16.

Bumps 21, a first connection adhesion layer 31, and a first semiconductor chip SC1 may be formed on the base structure BS. The first semiconductor chip SC1 may include a substrate 11, a lower dielectric layer 12, a upper dielectric layer 13, lower pads 14, upper pads 15, and through vias 16. Bumps 21, a second connection adhesion layer 32, and a second semiconductor chip SC2 may be formed on the first semiconductor chip SC1. The second semiconductor chip SC2 may include a substrate 11, a lower dielectric layer 12, an upper dielectric layer 13, lower pads 14, upper pads 15, and through vias 16. Bumps 21, a lower adhesion layer 33, and a third semiconductor chip SC3 may be formed on the second semiconductor chip SC2. The third semiconductor chip SC3 may include a substrate 11, a lower dielectric layer 12, an upper dielectric layer 13, lower pads 14, upper pads 15, and through vias 16.

Referring to FIG. 2B, the lower adhesion layer 33 may be cut. In some embodiments, the lower adhesion layer 33 may be cut with a laser irradiated thereto. In some embodiments, a blade may be used to cut the lower adhesion layer 33. The lower adhesion layer 33 may be cut to form a first cutting surface CS1 and a second cutting surface CS2 on the lower adhesion layer 33. The cutting of the lower adhesion layer 33 may form a first part 33_1 and a second part 33_2 of the lower adhesion layer 33.

A fourth semiconductor chip SC4 may be formed. The fourth semiconductor chip SC4 may include a substrate 11, a lower dielectric layer 12, and lower pads 14. Bumps 21 may be formed on the lower pads 14 of the fourth semiconductor chip SC4. A preliminary upper adhesion layer p34 may be formed to cover the bumps 21 and a bottom surface of the lower dielectric layer 12 of the fourth semiconductor chip SC4. The preliminary upper adhesion layer p34 may be formed of an adhesive polymer material. For example, the preliminary upper adhesion layer p34 may include a non-conductive film (NCF).

Referring to FIG. 2C, bumps 21, an upper adhesion layer 34, and the fourth semiconductor chip SC4 may be formed on the third semiconductor chip SC3. In some embodiments, a thermal compression process may be employed to form the bumps 21, the upper adhesion layer 34, and the fourth semiconductor chip SC4 on the third semiconductor chip SC3. The thermal compression process may be performed at a temperature of, for example, 230° C. or higher.

The preliminary upper adhesion layer p34 may be converted into the upper adhesion layer 34. The preliminary upper adhesion layer p34 may be converted to allow the upper adhesion layer 34 to contact the first cutting surface CS1 and the second cutting surface CS2 of the lower adhesion layer 33.

Referring to FIG. 1A, a molding layer 40 may be formed. A terminal 22 may be formed on the lower pad 14 of the base structure BS.

In a method of fabricating a semiconductor package according to some embodiments, the lower adhesion layer 33 may be cut to form the upper adhesion layer 34 located at a relatively low level. Therefore, the upper adhesion layer 34 may not be exposed to outside the molding layer 40.

Figure 3:
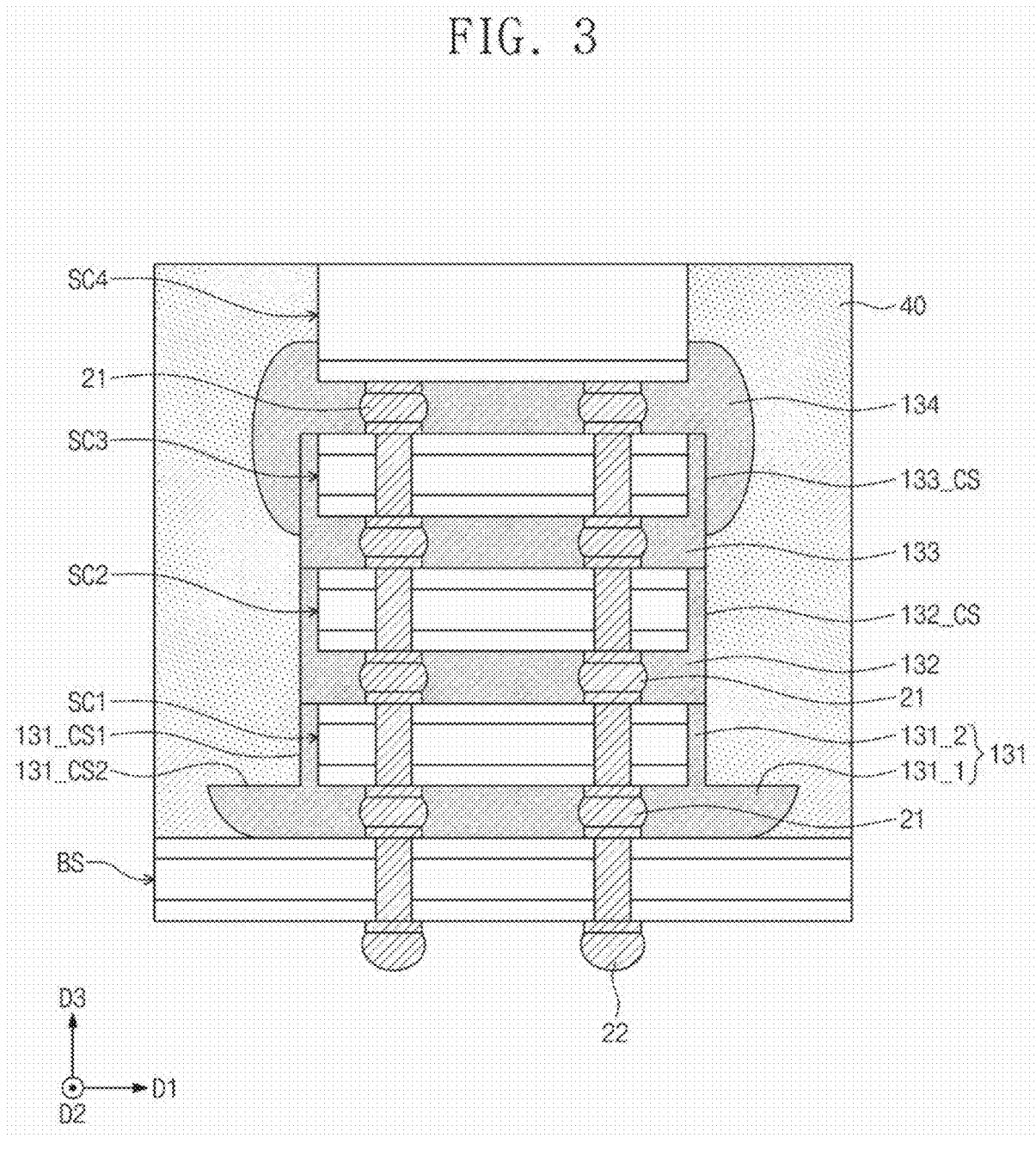
FIG. 3 illustrates a cross-sectional view showing a semiconductor package, according to example embodiments.

FIG. 3 illustrates a cross-sectional view showing a semiconductor package according to example embodiments.

Referring to FIG. 3, a semiconductor package may include a base structure BS, a first connection adhesion layer 131 on the base structure BS, a first semiconductor chip SC1 on the first connection adhesion layer 131, a second connection adhesion layer 132 on the first semiconductor chip SC1, a second semiconductor chip SC2 on the second connection adhesion layer 132, a lower adhesion layer 133 on the second semiconductor chip SC2, a third semiconductor chip SC3 on the lower adhesion layer 133, an upper adhesion layer 134 on the third semiconductor chip SC3, and a fourth semiconductor chip SC4 on the upper adhesion layer 134. Each of the first connection adhesion layer 131, the second connection adhesion layer 132, the lower adhesion layer 133, and the upper adhesion layer 134 may be formed of an adhesive polymer material. For example, the first connection adhesion layer 131, the second connection adhesion layer 132, the lower adhesion layer 133, and the upper adhesion layer 134 may include a non-conductive film (NCF).

The semiconductor package may further include bumps 21 and terminals 22. The semiconductor package may further include a molding layer 40.

The lower adhesion layer 133 may include a cutting surface 133_CS that extends in the third direction D3. The upper adhesion layer 134 may be attached to the cutting surface 133_CS of the lower adhesion layer 133. The second connection adhesion layer 132 may include a cutting surface 132_CS that extends in the third direction D3. The first connection adhesion layer 131 may include a first cutting surface 131_CS1 that extends in the third direction D3 and a second cutting surface 131_CS2 that extends in the first direction D1. The first cutting surface 131_CS1 of the first connection adhesion layer 131 may be coplanar with the cutting surface 133_CS of the lower adhesion layer 133.

The first connection adhesion layer 131 may include a first part 131_1 that defines the second cutting surface 131_CS2 of the first connection adhesion layer 131, and may also include a second part 131_2 that defines the first cutting surface 131_CS1 of the first connection adhesion layer 131. The first part 131_1 of the first connection adhesion layer 131 may have a width greater than that of the second part 131_2 of the first connection adhesion layer 131.

Figure 4A:
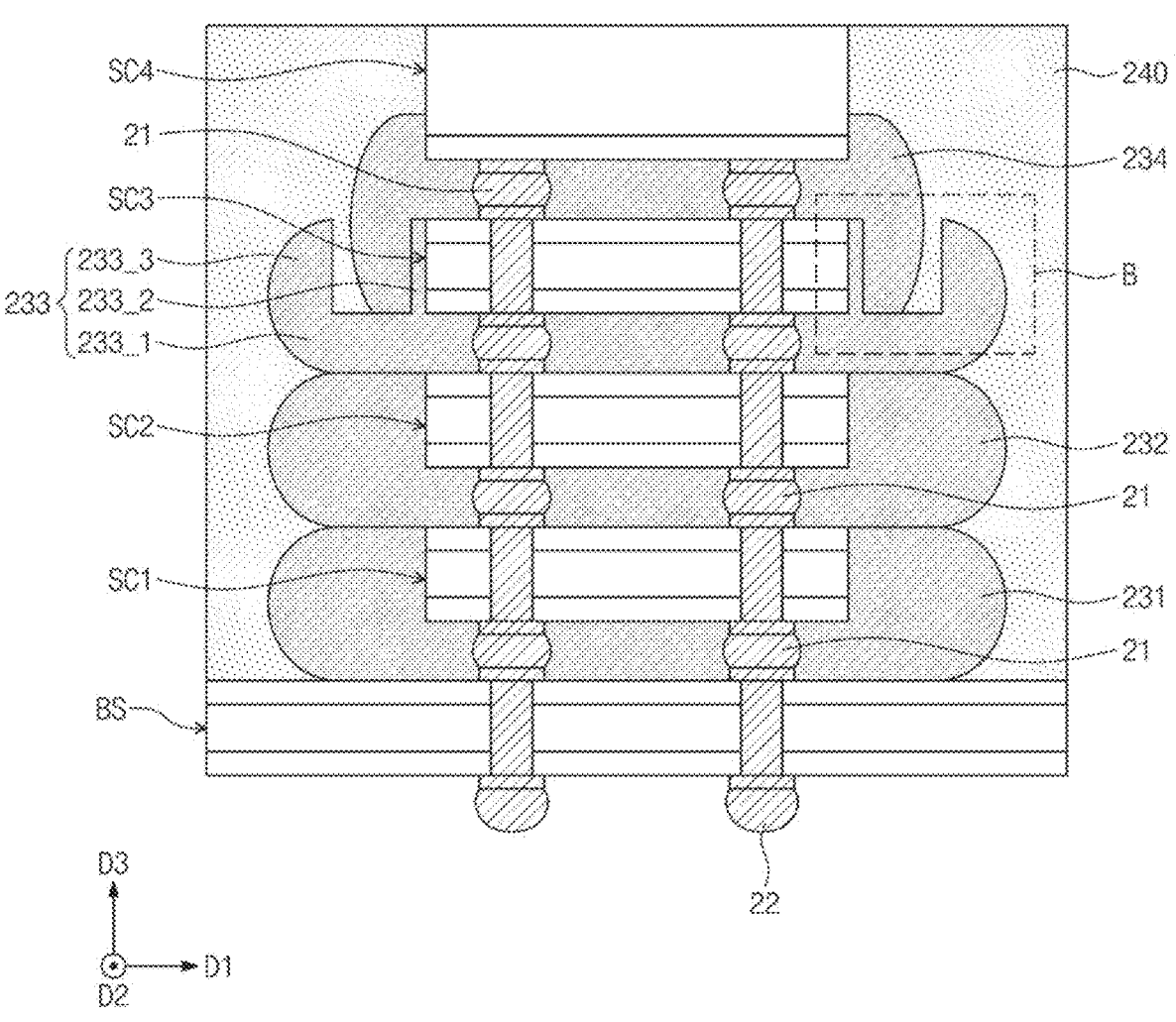
FIG. 4A illustrates a cross-sectional view showing a semiconductor package, according to example embodiments.
Figure 4B:
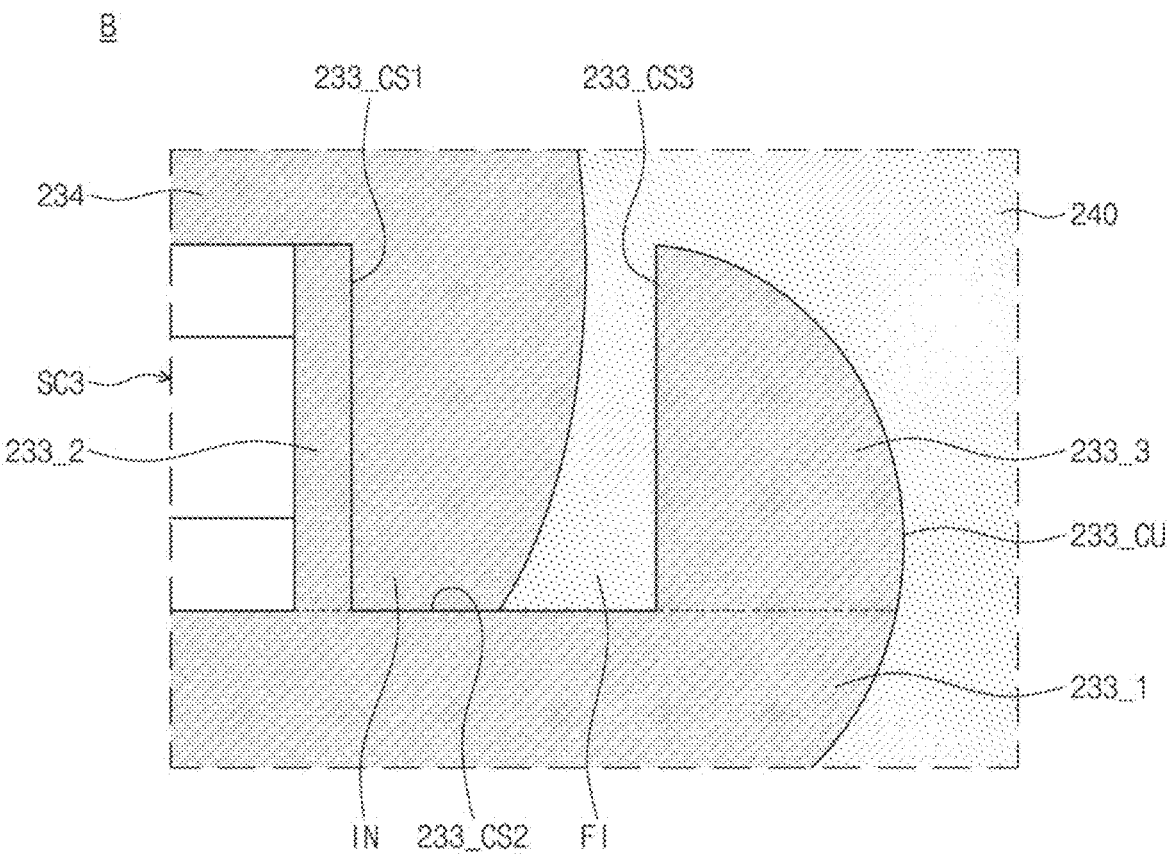
FIG. 4B illustrates an enlarged view showing section B of FIG. 4A.
Figure 4B:
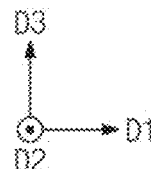

FIG. 4A illustrates a cross-sectional view showing a semiconductor package according to example embodiments. FIG. 4B illustrates an enlarged view showing section B of FIG. 4A.

Referring to FIG. 4A, a semiconductor package may include a base structure BS, a first connection adhesion layer 231 on the base structure BS, a first semiconductor chip SC1 on the first connection adhesion layer 231, a second connection adhesion layer 232 on the first semiconductor chip SC1, a second semiconductor chip SC2 on the second connection adhesion layer 232, a lower adhesion layer 233 on the second semiconductor chip SC2, a third semiconductor chip SC3 on the lower adhesion layer 233, an upper adhesion layer 234 on the third semiconductor chip SC3, and a fourth semiconductor chip SC4 on the upper adhesion layer 234. The semiconductor package may further include bumps 21 and terminals 22. The semiconductor package may further include a molding layer 240. Each of the first connection adhesion layer 231, the second connection adhesion layer 232, the lower adhesion layer 233, and the upper adhesion layer 234 may be formed of an adhesive polymer material. For example, the first connection adhesion layer 231, the second connection adhesion layer 232, the lower adhesion layer 233, and the upper adhesion layer 234 may include a non-conductive film (NCF).

The lower adhesion layer 233 may include a first part 233_1, a second part 233_2 on the first part 233_1, and a third part 233_3 on the first part 233_1. The second and third parts 233_2 and 233_3 of the lower adhesion layer 233 may be located at a higher level than that of the first part 233_1 of the lower adhesion layer 233. The second and third parts 233_2 and 233_3 of the lower adhesion layer 233 may be located at the same level. The second and third parts 233_2 and 233_3 of the lower adhesion layer 233 may be spaced apart from each other. For example, the second and third parts 233_2 and 233_3 of the lower adhesion layer 233 may be spaced apart from each other in the first direction D1. The second part 233_2 may contact a sidewall of the third semiconductor chip SC3, and the third part 233_3 may be spaced apart from the third semiconductor chip SC3. The first part 233_1 of the lower adhesion layer 233 may connect to each other the second part 233_2 and the third part 233_3 of the lower adhesion layer 233.

The lower adhesion layer 233 may include a plurality of third parts 233_3. The third semiconductor chip SC3 and the second part 233_2 of the lower adhesion layer 233 may be disposed between the third parts 233_3 of the lower adhesion layer 233. For example, the third semiconductor chip SC3 and the second part 233_2 of the lower adhesion layer 233 may be disposed between two third parts 233_3 of the lower adhesion layer 233 that are spaced apart from each other in the first direction D1.

Referring to FIG. 4B, the lower adhesion layer 233 may include a first cutting surface 233_CS1, a second cutting surface 233_CS2, and a third cutting surface 233_CS3. The third cutting surface 233_CS3 may be a sidewall of the third part 233_3 of the lower adhesion layer 233.

The third cutting surface 233_CS3 of the lower adhesion layer 233 may extend in the third direction D3. The third cutting surface 233_CS3 of the lower adhesion layer 233 may be connected to the second cutting surface 233_CS2 of the lower adhesion layer 233. A corner may be provided to connect to each other the second cutting surface 233_CS2 and the third cutting surface 233_CS3 of the lower adhesion layer 233. For example, the second cutting surface 233_CS2 and the third cutting surface 233_CS3 of the lower adhesion layer 233 may intersect one another at a right angle. The third cutting surface 233_CS3 of the lower adhesion layer 233 may be connected to a curved sidewall 233_CU of the lower adhesion layer 233. A corner may be provided to connect the third cutting surface 233_CS3 of the lower adhesion layer 233 to the curved sidewall 233_CU of the lower adhesion layer 233.

The upper adhesion layer 234 may be spaced apart from the third cutting surface 233_CS3 of the lower adhesion layer 233. The upper adhesion layer 234 may be spaced apart from the third part 233_3 of the lower adhesion layer 233. The upper adhesion layer 234 may include an intervening part IN interposed between the second part 233_2 and the third part 233_3 of the lower adhesion layer 233. The intervening part IN of the upper adhesion layer 234 may be in contact with the first part 233_1 and the second part 233_2 of the lower adhesion layer 233. The intervening part IN of the upper adhesion layer 234 may be spaced apart from the third part 233_3 of the lower adhesion layer 233. The intervening part IN of the upper adhesion layer 234 may be in contact with the first cutting surface 233_CS1 and the second cutting surface 233_CS2 of the lower adhesion layer 233. The intervening part IN of the upper adhesion layer 234 may be in contact with the third cutting surface 233_CS3 of the lower adhesion layer 233. The intervening part IN of the upper adhesion layer 234 may be located at a lower level than that of an uppermost portion of the second part 233_2 of the lower adhesion layer 233. The intervening part IN of the upper adhesion layer 234 may be located at a lower level than that of an uppermost portion of the third part 233_3 of the lower adhesion layer 233.

The molding layer 240 may include a filling part FI interposed between the third part 233_3 of the lower adhesion layer 233 and the intervening part IN of the upper adhesion layer 234. The filling part FI of the molding layer 240 may be in contact with the first part 233_1 and the third part 233_3 of the lower adhesion layer 233. The filling part FI of the molding layer 240 may be spaced apart from the second part 233_2 of the lower adhesion layer 233. The filling part FI of the molding layer 240 may be in contact with the second cutting surface 233_CS2 and the third cutting surface 233_CS3 of the lower adhesion layer 233. The filling part FI of the molding layer 240 may be spaced apart from the first cutting surface 233_CS1 of the lower adhesion layer 233. The filling part FI of the molding layer 240 may be located at a lower level than that of the uppermost portion of the second part 233_2 of the lower adhesion layer 233. The filling part FI of the molding layer 240 may be located at a lower level than that of the uppermost portion of the third part 233_3 of the lower adhesion layer 233.

Figure 5:
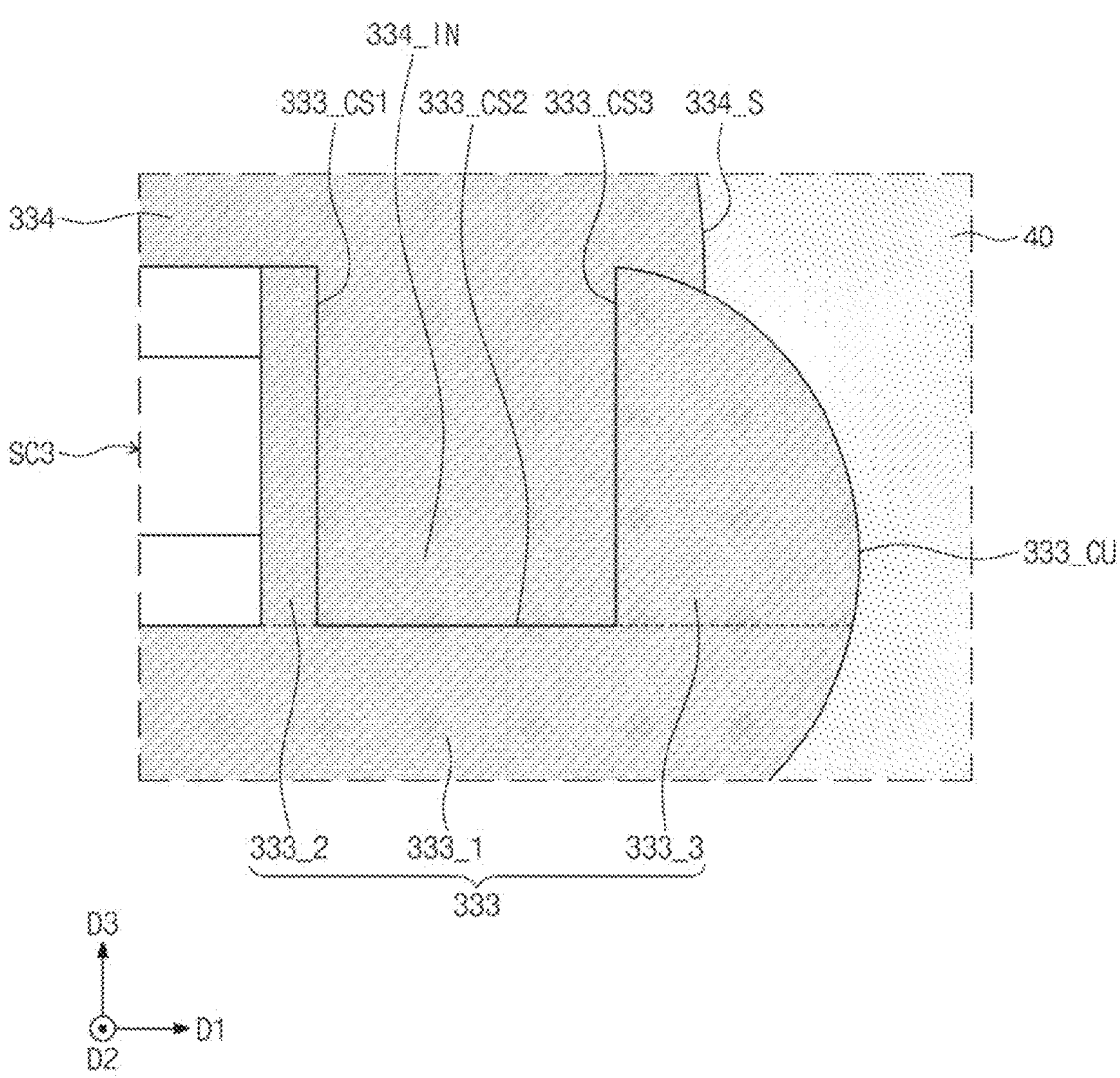
FIG. 5 illustrates an enlarged cross-sectional view showing a semiconductor package, according to example embodiments.

FIG. 5 illustrates an enlarged cross-sectional view showing a semiconductor package according to example embodiments. For example, FIG. 5 illustrates an enlarged view showing section B of, for example, FIG. 4A. In FIG. 5, a lower adhesion layer 333 and an upper adhesion layer 334 respectively correspond to the lower adhesion layer 233 and the upper adhesion layer 234 of FIG. 4A.

Referring to FIG. 5, a semiconductor package may include a lower adhesion layer 333 including a first part 333_1, a second part 333_2, and a third part 333_3. The lower adhesion layer 333 may include a first cutting surface 333_CS1, a second cutting surface 333_CS2, and a third cutting surface 333_CS3. An upper adhesion layer 334 may include an intervening part 334_IN interposed between the second part 333_2 and the third part 333_3 of the lower adhesion layer 333.

The intervening part 334_IN of the upper adhesion layer 334 may be in contact with the first part 333_1, the second part 333_2, and the third part 333_3 of the lower adhesion layer 333. The intervening part 334_IN of the upper adhesion layer 334 may be in contact with the first cutting surface 333_CS1, the second cutting surface 333_CS2, and the third cutting surface 333_CS3 of the lower adhesion layer 333.

The upper adhesion layer 334 may have a sidewall 34_S connected to a curved sidewall 333_CU of the lower adhesion layer 333.

Each of the lower adhesion layer 333 and the upper adhesion layer 334 may be formed of an adhesive polymer material. For example, the lower adhesion layer 333 and the upper adhesion layer 334 may include a non-conductive film (NCF).

Figure 6:
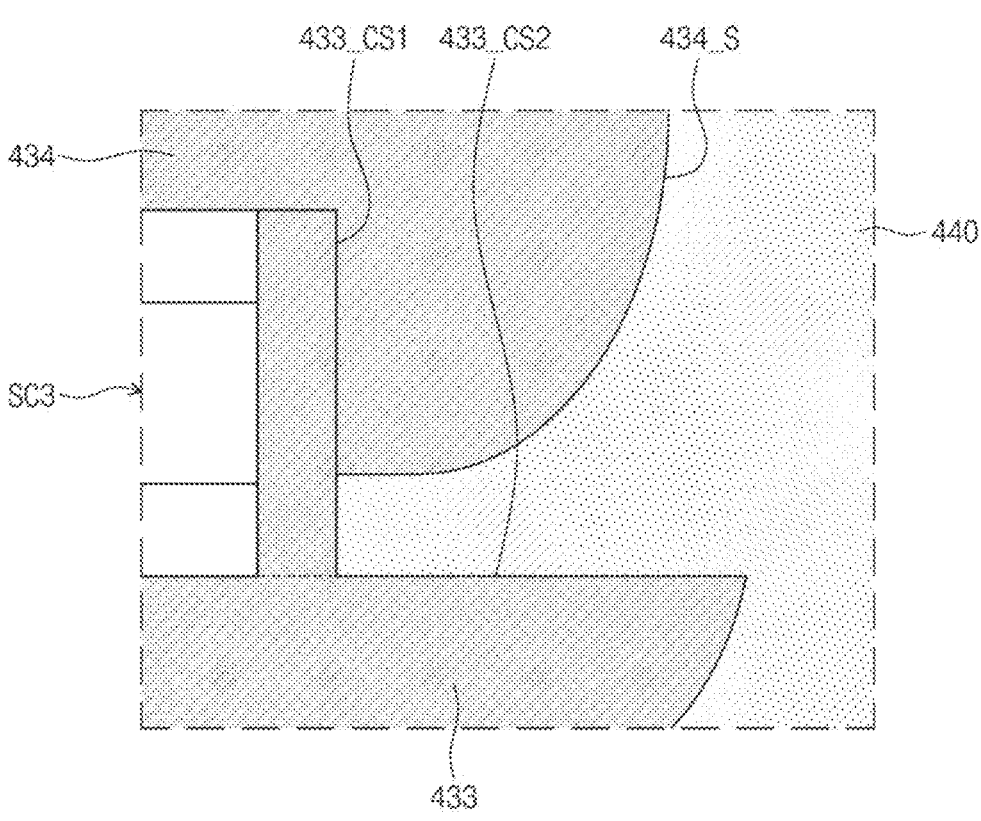
FIG. 6 illustrates an enlarged cross-sectional view showing a semiconductor package, according to example embodiments.
Figure 6:
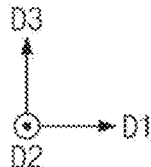

FIG. 6 illustrates an enlarged cross-sectional view showing a semiconductor package according to example embodiments. For example, FIG. 6 illustrates an enlarged view showing section B of, for example, FIG. 1A. In FIG. 6, a lower adhesion layer 433 and an upper adhesion layer 434 respectively correspond to the lower adhesion layer 33 and the upper adhesion layer 34 of FIG. 1A.

Referring to FIG. 6, a semiconductor package may include a lower adhesion layer 433 including a first cutting surface 433_CS1 and a second cutting surface 433_CS2. An upper adhesion layer 434 may be in contact with the first cutting surface 433_CS1 of the lower adhesion layer 433. The upper adhesion layer 434 may have a sidewall 434_S connected to the first cutting surface 433_CS1 of the lower adhesion layer 433. The upper adhesion layer 434 may be spaced apart from the second cutting surface 433_CS2 of the lower adhesion layer 433. A molding layer 440 may be in contact with the first cutting surface 433_CS1 of the lower adhesion layer 433.

Figure 7:
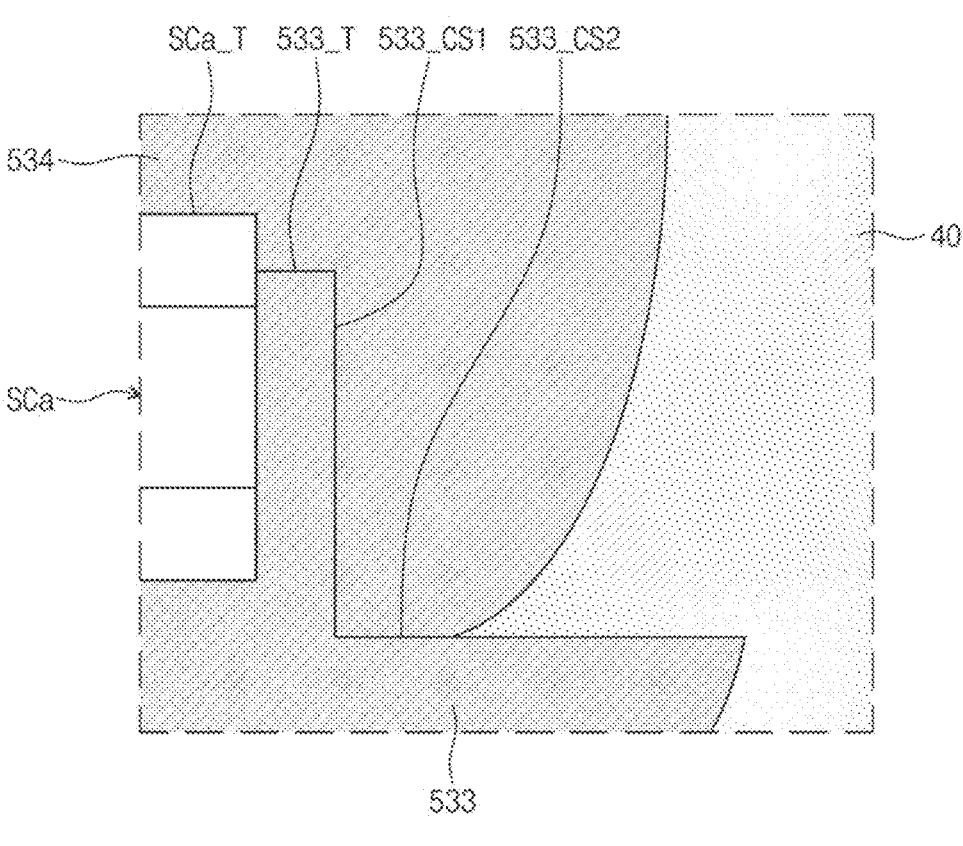
FIG. 7 illustrates an enlarged cross-sectional view showing a semiconductor package, according to example embodiments.
Figure 7:
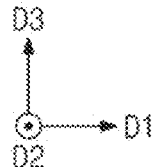

FIG. 7 illustrates an enlarged cross-sectional view showing a semiconductor package according to example embodiments. For example, FIG. 7 illustrates an enlarged view showing section B of, for example, FIG. 1A. In FIG. 7, a lower adhesion layer 533, an upper adhesion layer 534, and a semiconductor chip SCa respectively correspond to the lower adhesion layer 33, the upper adhesion layer 34, and the third semiconductor chip SC3 of FIG. 1A.

Referring to FIG. 7, a semiconductor package may include a lower adhesion layer 533 including a top surface 533_T, a first cutting surface 533_CS1, and a second cutting surface 533_CS2. A semiconductor chip SCa may be provided between the lower adhesion layer 533 and an upper adhesion layer 534. The top surface 533_T of the lower adhesion layer 533 may be located at a lower level than that of a top surface SCa_T of the semiconductor chip SCa.

Figure 8:
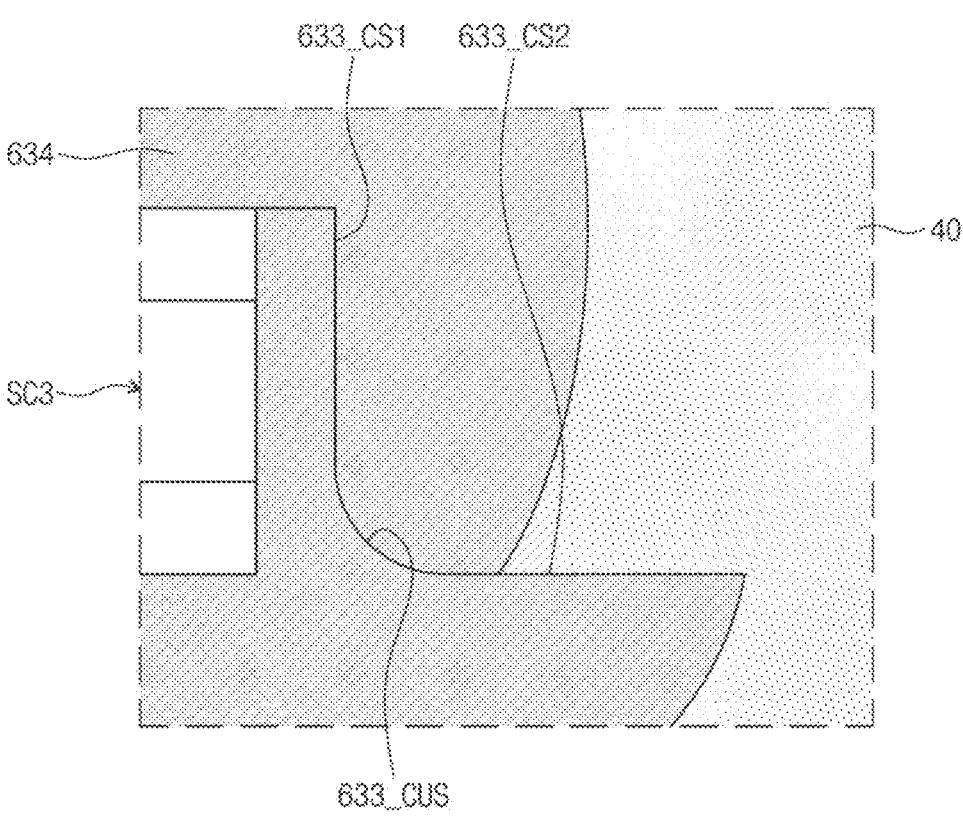
FIG. 8 illustrates an enlarged cross-sectional view showing a semiconductor package, according to example embodiments.
Figure 8:
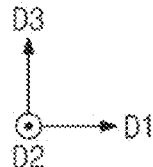

FIG. 8 illustrates an enlarged cross-sectional view showing a semiconductor package according to example embodiments. For example, FIG. 8 illustrates an enlarged view showing section B of, for example, FIG. 1A. In FIG. 8, a lower adhesion layer 633 and an upper adhesion layer 634 respectively correspond to the lower adhesion layer 33 and the upper adhesion layer 34 of FIG. 1A.

Referring to FIG. 8, a semiconductor package may include a lower adhesion layer 633 including a first cutting surface 633_CS1, a second cutting surface 633_CS2, and a curved surface 633_CUS. The lower adhesion layer 633 may be curved on the curved surface 633_CUS thereof. The lower adhesion layer 633 may be flat on the first cutting surface 633_CS1 and the second cutting surface 633_CS2 thereof. The curved surface 633_CUS of the lower adhesion layer 633 may connect to each other the first cutting surface 633_CS1 and the second cutting surface 633_CS2 of the lower adhesion layer 633. The curved surface 633_CUS of the lower adhesion layer 633 may be disposed between the first cutting surface 633_CS1 and the second cutting surface 633_CS2 of the lower adhesion layer 633. An upper adhesion layer 634 may be in contact with the first cutting surface 633_CS1, the second cutting surface 633_CS2, and the curved surface 633_CUS of the lower adhesion layer 633.

Figure 9:
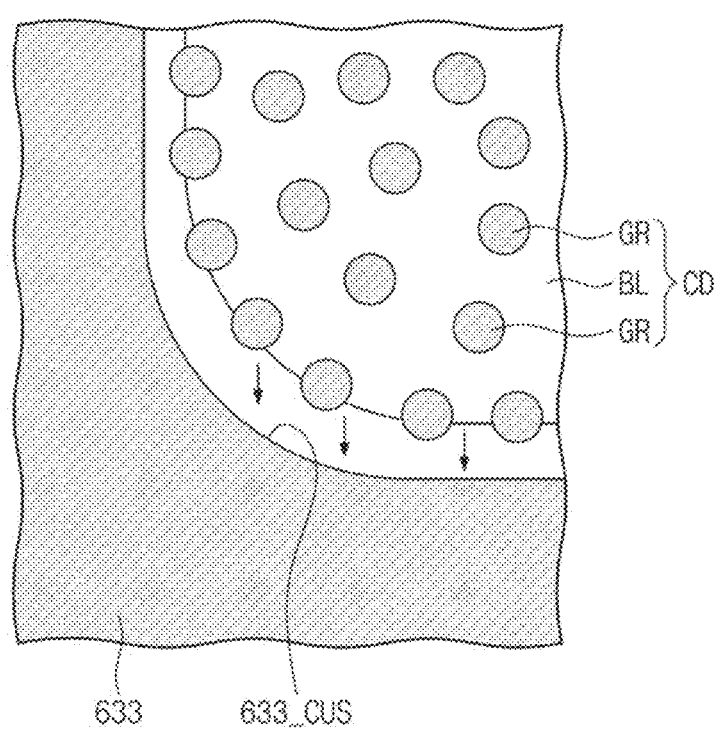
FIG. 9 illustrates a cross-sectional view showing a method of fabricating the semiconductor package of FIG. 8.
Figure 9:
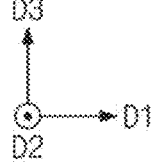

FIG. 9 illustrates a cross-sectional view showing an example method of fabricating the semiconductor package according to FIG. 8. The example method of FIG. 9 may be provided in place of or in addition to the cutting with a laser or blade, as discussed above in connection with FIG. 2B.

Referring to FIG. 9, a cutting device CD for cutting the lower adhesion layer 633 may include a blade BL and grits GR on the blade BL. The grits GR may include, for example, diamond. As the lower adhesion layer 633 is cut by the cutting device CD, the lower adhesion layer 633 may have a shape that corresponds to that of the cutting device CD. In some embodiments, the cutting device CD may have an uneven surface, and thus the lower adhesion layer 633 may include a curved surface 633_CUS. After the lower adhesion layer 633 is cut, the method may continue as discussed above in connection with FIGS. 2B and 2C.

Figure 10:
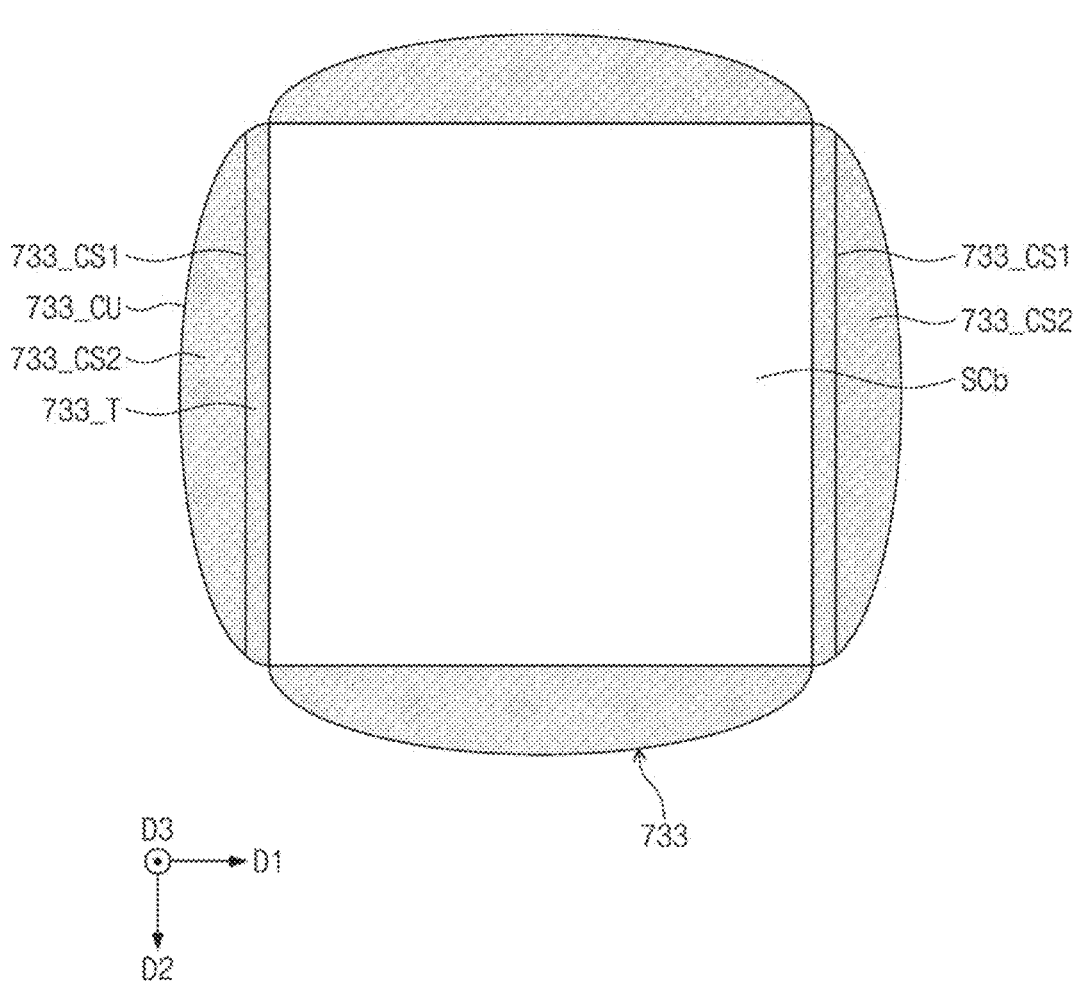
FIG. 10 illustrates a plan view showing a lower adhesion layer of a semiconductor package, according to example embodiments.

FIG. 10 illustrates a plan view showing a lower adhesion layer of a semiconductor package according to example embodiments.

Referring to FIG. 10, a semiconductor package may include a lower adhesion layer 733 that surrounds a semiconductor chip SCb. In example embodiments, the lower adhesion layer 733 and the semiconductor chip SCb may respectively correspond to the lower adhesion layer 33 and the semiconductor chip SC3 of FIG. 1A. The lower adhesion layer 733 may include two first cutting surfaces 733_CS1 and two second cutting surfaces 733_CS2. The first cutting surfaces 733_CS1 of the lower adhesion layer 733 may be disposed correspondingly adjacent to opposite sidewalls of the semiconductor chip SCb. The first cutting surface 733_CS1 of the lower adhesion layer 733 may be connected to a top surface 733_T and a second cutting surface 733_CS2 of the lower adhesion layer 733. The second cutting surface 733_CS2 of the lower adhesion layer 733 may be connected to a curved sidewall 733 CU of the lower adhesion layer 733.

Figure 11:
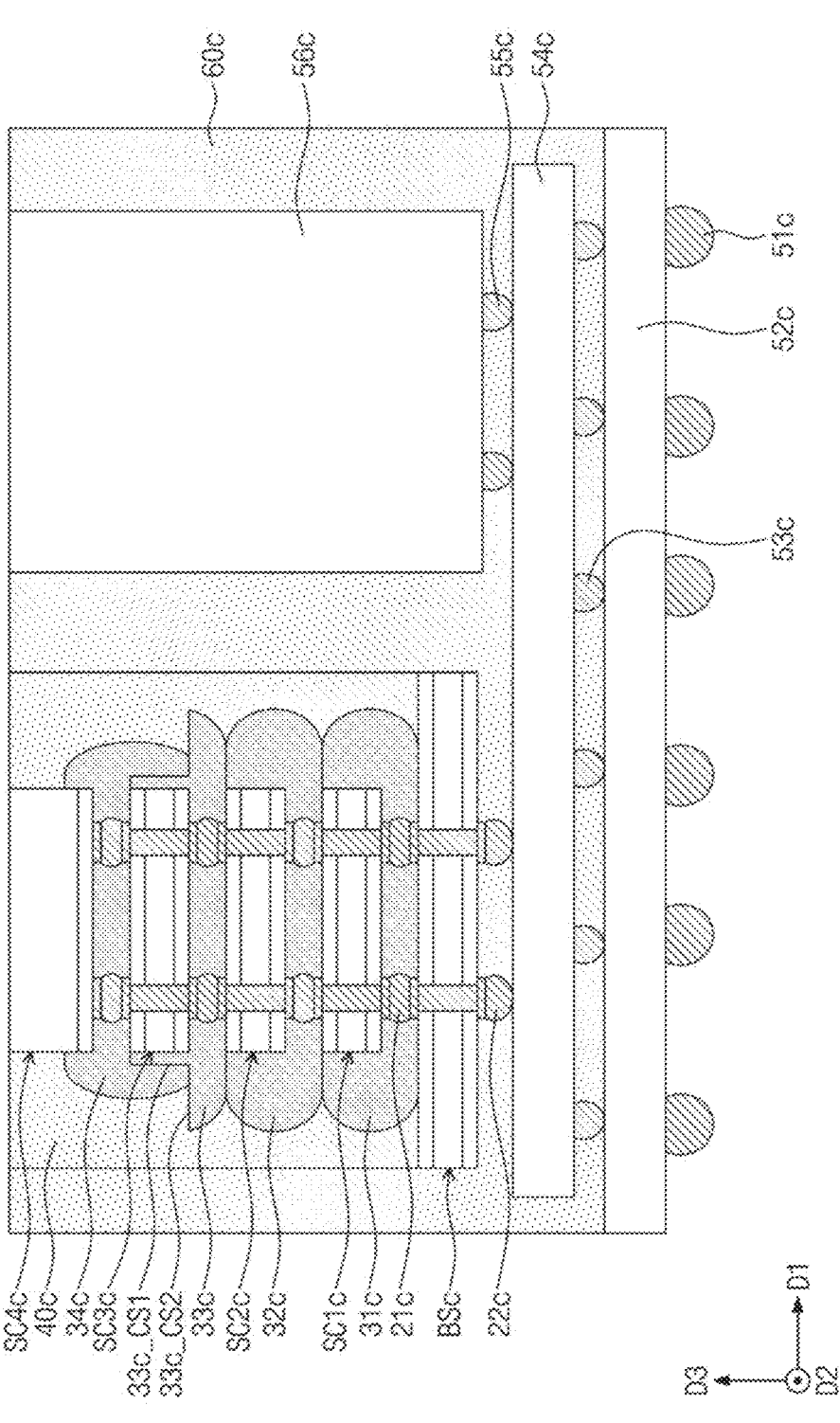
FIG. 11 illustrates a cross-sectional view showing a semiconductor package, according to example embodiments.

FIG. 11 illustrates a cross-sectional view showing a semiconductor package according to example embodiments.

Referring to FIG. 11, a semiconductor package may include a package substrate 52c. For example, the package substrate 52c may be a printed circuit board. First terminals 51c may be provided which are electrically connected to the package substrate 52c. The semiconductor package may be mounted through the first terminals 51c on an external apparatus (e.g., main board).

An interposer 54c may be provided on the package substrate 52c. Second terminals 53c may be provided to electrically connect the package substrate 52c and the interposer 54c to each other. The second terminals 53c may be provided between the package substrate 52c and the interposer 54c.

A processor chip 56c may be provided on the interposer 54c. For example, the processor chip 56c may be a graphic processing unit (GPU) or a central processing unit (CPU). Third terminals 55c may be provided to electrically connect the processor chip 56c and the interposer 54c to each other. The third terminals 55c may be provided between the processor chip 56c and the interposer 54c.

The interposer 54c may be provided thereon with a base structure BSc and first, second, third, and fourth semiconductor chips SC1c, SC2b, SC3c, and SC4c that are sequentially disposed. Bumps 21c may be provided between neighboring ones of the base structures BSc and the first, second, third, and fourth semiconductor chips SC1c, SC2b, SC3c, and SC4c. The base structure BSc, the first, second, third, and fourth semiconductor chips SC1c, SC2b, SC3c, and SC4c, and the bumps 21c of FIG. 11 may respectively correspond to the base structure BS, the first, second, third, and fourth semiconductor chips SC1, SC2, SC3, and SC4, and the bumps 21 of FIG. 1A.

Fourth terminals 22c may be provided to electrically connect the base structure BSc and the interposer 54c to each other. The fourth terminals 22c may be provided between the base structure BSc and the interposer 54c. A first molding layer 40c may be provided to surround the first, second, third, and fourth semiconductor chips SC1c, SC2b, SC3c, and SC4c. A second molding layer 60c may be provided to surround the interposer 54c, the processor chip 56c, the base structure BSc, and the first, second, third, and fourth semiconductor chips SC1c, SC2b, SC3c, and SC4c.

In a semiconductor package according to some embodiments of the present inventive concepts, a lower adhesion layer may include cutting surfaces to cause an upper adhesion layer to rest at a relatively low level. Accordingly, the upper adhesion layer may be covered with a molding layer and thus may not be exposed.

Although the present invention has been described in connection with the some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
   a first semiconductor chip;
   a lower adhesion layer on the first semiconductor chip;
   a second semiconductor chip on the lower adhesion layer;
   an upper adhesion layer on the second semiconductor chip; and
   a third semiconductor chip on the upper adhesion layer,
   wherein the lower adhesion layer contacts a bottom surface and a side surface of the second semiconductor chip,
   wherein the lower adhesion layer includes a first cutting surface connected to a top surface of the lower adhesion layer,
   wherein at least a portion of the first cutting surface is parallel to the side surface of the second semiconductor chip, and
   wherein the upper adhesion layer is in contact with the first cutting surface of the lower adhesion layer.

2. The semiconductor package of claim 1, wherein the lower adhesion layer further includes:
   a curved sidewall; and
   a second cutting surface connected to the curved sidewall of the lower adhesion layer.

3. The semiconductor package of claim 2, wherein the upper adhesion layer is in contact with the second cutting surface of the lower adhesion layer.

4. The semiconductor package of claim 2,
   wherein the second cutting surface of the lower adhesion layer is parallel to the top surface of the lower adhesion layer, and
   wherein the first cutting surface of the lower adhesion layer intersects the top surface of the lower adhesion layer and the second cutting surface of the lower adhesion layer.

5. The semiconductor package of claim 2, wherein the lower adhesion layer further includes a curved surface that connects the first cutting surface of the lower adhesion layer to the second cutting surface of the lower adhesion layer.

6. The semiconductor package of claim 1, wherein the lower adhesion layer further includes:

a second cutting surface connected to the first cutting surface of the lower adhesion layer;

a third cutting surface connected to the second cutting surface of the lower adhesion layer; and a curved sidewall connected to the third cutting surface of the lower adhesion layer.

7. The semiconductor package of claim 6, wherein the upper adhesion layer is in contact with the second cutting surface of the lower adhesion layer and is spaced apart from the third cutting surface of the lower adhesion layer.

8. The semiconductor package of claim 6, wherein the upper adhesion layer is in contact with the second cutting surface of the lower adhesion layer, the third cutting surface of the lower adhesion layer, and the curved sidewall of the lower adhesion layer.

9. The semiconductor package of claim 1, further comprising:

a connection adhesion layer below the first semiconductor chip, wherein the connection adhesion layer includes:

a first cutting surface connected to a top surface of the connection adhesion layer;

a second cutting surface connected to the first cutting surface of the connection adhesion layer; and a curved sidewall connected to the second cutting surface of the connection adhesion layer.

10. A semiconductor package, comprising:

a first semiconductor chip;

a lower adhesion layer on the first semiconductor chip;

a second semiconductor chip on the lower adhesion layer;

an upper adhesion layer on the second semiconductor chip; and a third semiconductor chip on the upper adhesion layer, wherein the lower adhesion layer contacts a bottom surface and a side surface of the second semiconductor chip, wherein the lower adhesion layer includes a first part and a second part on the first part of the lower adhesion layer, wherein a width of the first part of the lower adhesion layer is greater than a width of the second part of the lower adhesion layer, and wherein the second part of the lower adhesion layer includes a first cutting surface in contact with the upper adhesion layer, and wherein at least a portion of the first cutting surface is parallel to the side surface of the second semiconductor chip.

11. The semiconductor package of claim 10, wherein the first part of the lower adhesion layer includes a curved sidewall and a second cutting surface connected to the curved sidewall.

12. The semiconductor package of claim 11, wherein the second cutting surface of the first part of the lower adhesion layer is in contact with the upper adhesion layer.

13. The semiconductor package of claim 10, wherein the lower adhesion layer further includes a third part on the first part of the lower adhesion layer, wherein the third part of the lower adhesion layer is spaced apart from the second part of the lower adhesion layer.

14. The semiconductor package of claim 13, wherein the upper adhesion layer includes an intervening part between the second and third parts of the lower adhesion layer.

15. The semiconductor package of claim 14, wherein the intervening part is in contact with the third part of the lower adhesion layer.

16. The semiconductor package of claim 14, wherein the intervening part is spaced apart from the third part of the lower adhesion layer.

17. The semiconductor package of claim 16, further comprising:

a molding layer that surrounds the first to third semiconductor chips, the lower adhesion layer, and the upper adhesion layer, wherein the molding layer includes a filling part between the second and third parts of the lower adhesion layer.

18. The semiconductor package of claim 17, wherein the filling part is in contact with the third part of the lower adhesion layer and the first part of the lower adhesion layer.

19. A semiconductor package, comprising:

a base structure;

a first connection adhesion layer on the base structure;

a first semiconductor chip on the first connection adhesion layer;

a second connection adhesion layer on the first semiconductor chip;

a second semiconductor chip on the second connection adhesion layer;

a lower adhesion layer on the second semiconductor chip;

a third semiconductor chip on the lower adhesion layer;

an upper adhesion layer on the third semiconductor chip;

a fourth semiconductor chip on the upper adhesion layer;

a plurality of bumps that connect the first to fourth semiconductor chips to each other; and a molding layer that surrounds the first to fourth semiconductor chips, wherein each of the first to third semiconductor chips includes:

a lower dielectric layer;

a substrate on the lower dielectric layer;

an upper dielectric layer on the substrate; and a through via that penetrates the substrate, wherein the lower adhesion layer includes:

a first cutting surface connected to a top surface of the lower adhesion layer; and a second cutting surface connected to the first cutting surface, wherein the lower adhesion layer contacts a bottom surface and a side surface of the third semiconductor chip, wherein the first cutting surface is parallel to the side surface of the third semiconductor chip, and the second cutting surface is parallel to the bottom surface of the third semiconductor chip, and wherein the upper adhesion layer is in contact with the first cutting surface and the second cutting surface.

20. The semiconductor package of claim 19, wherein the lower adhesion layer further includes a curved sidewall connected to the second cutting surface, and wherein a distance between the curved sidewall and the third semiconductor chip is greater than a distance between the second cutting surface and the third semiconductor chip.

* * * * *